United States Patent
Chen et al.

(10) Patent No.: US 6,228,730 B1
(45) Date of Patent: May 8, 2001

(54) METHOD OF FABRICATING FIELD EFFECT TRANSISTOR

(75) Inventors: Tung-Po Chen, Taichung; Jih-Wen Chou, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/301,211

(22) Filed: Apr. 28, 1999

(51) Int. Cl.[7] ............... H01L 21/336; H01L 21/3205; H01L 21/4763
(52) U.S. Cl. ............... 438/301; 438/305; 438/586
(58) Field of Search ............... 257/67; 438/361, 438/474, 371, 507, 309, 305, 586

(56) References Cited

U.S. PATENT DOCUMENTS

| | | | |
|---|---|---|---|
| 5,153,145 | * | 10/1992 | Lee et al. ............... 437/44 |
| 5,196,360 | * | 3/1993 | Doan et al. ............... 437/41 |
| 5,200,352 | * | 4/1993 | Pfiester ............... 437/44 |
| 5,241,193 | * | 8/1993 | Pfiester et al. ............... 437/106 |
| 5,319,232 | * | 6/1994 | Pfiester ............... 257/344 |
| 5,679,589 | * | 10/1997 | Lee et al. ............... 437/40 GS |

* cited by examiner

*Primary Examiner*—John F. Niebling
*Assistant Examiner*—Walter L. Lindsay, Jr.
(74) *Attorney, Agent, or Firm*—Thomas, Kayden, Horstemeyer & Risley

(57) ABSTRACT

A method of fabricating a field effect transistor, wherein a substrate with a gate is provided. A liner oxide layer and a first spacer are formed adjacent to the sides of the gate. An epitaxial silicon layer is formed at both sides of the gate in the substrate, while a shallow source/drain (S/D) extension junction is formed in the substrate below the epitaxial silicon layer. An oxide layer and a second spacer are formed to be closely connected to the first spacer and form the S/D region below the epitaxial silicon layer. A part of the epitaxial silicon layer is then transformed into a metal silicide layer, so as to complete the process of the field effect transistor.

17 Claims, 2 Drawing Sheets

METHOD OF FABRICATING FIELD EFFECT TRANSISTOR

BACKGROUND OF THE INVENTION

1. Field of Invention

The present invention relates to a method of fabricating a field effect transistor. More particularly, the present invention relates to a method of fabricating a field effect transistor with a shallow junction.

2. Description of Related Art

The field effect transistor is one of the most important electrical devices in the integrated circuit. As the size of the semiconductor device is reduced, many improvements have also been made in the steps for fabricating the transistor.

Conventionally, the process of fabricating a transistor is to form, after a gate is formed on a substrate, a lightly doped drain (LDD) in a substrate of a gate. Spacers are formed adjacent to both sides of the gate, while an ion implantation step is preformed with the spacers serving as the mask to form a source/drain (S/D) region in the substrate. A plug is formed for conduction so that the gate, source, and drain of the transistor are connected to the circuits. As the material of the plug is typically a metal conductor, and conduction between the source/drain region and the plug is not as perfect as expected. To improve the conduction between the plug and the S/D region, a metal silicide is usually formed on the surface of the S/D region.

The metal silicide is typically formed by a self-aligned silicide (salicide) process. A metal layer is formed to cover the gate and the S/D region after the S/D region is formed. A high temperature thermal process is then performed to produce a reaction between the metal layer and the silicon in the S/D region. As a result, a metal silicide is formed to reduce sheet resistance in the S/D region.

However, there are some problems associated with this method for forming the metal silicide. For example, the metal layer reacts with the silicon in the S/D region during metal silicide formation. A part of the structure in the S/D region is then damaged, causing problems of a direct contact between the metal silicide and the substrate and thus a failure of the device.

SUMMARY OF THE INVENTION

The present invention provides a method of fabricating a field effect transistor. A thicker metal silicide is formed as a contact in the S/D region to reduce a sheet resistance of the S/D region, while ensuring the integrity of the S/D region so as to improve the performance of the field effect transistor.

The invention provides a method of fabricating a field effect transistor. A substrate with a gate is provided in the invention, wherein the gate includes a dielectric layer and an electrode. A liner oxide and a first spacer are formed adjacent to sidewalls of the gate. An epitaxial silicon layer is then formed on the first spacer on the substrate. With the gate and the first spacer serving as the mask, an ion implantation step is performed to form a shallow S/D extension junction in the substrate below the epitaxial silicon layer. An oxide layer and a second spacer are formed adjacent to the first spacer. With the gate, the first spacer, and the second spacer serving as the mask, a further ion implantation step is performed to form the S/D region in the substrate. A self-aligned silicide process is performed to transform the epitaxial silicon layer at both sides of the second spacer into the metal silicide, thus completing the process of the field effect transistor.

The invention includes a feature to form an epitaxial silicon layer at both sides of the first spacer on the substrate before forming the shallow S/D extension junction. This epitaxial silicon layer provides enough silicon atoms consumed for forming the metal silicide in the subsequent step. As a result, the shallow S/D extension junction and the S/D region are not damaged by the nitridation reaction and a thinner shallow S/D extension junction is formed. Furthermore, since the shallow S/D extension junction is not formed when the epitaxial silicon layer is formed, the high temperature during the epitaxial silicon layer formation does not cause a diffusion of the doped ions in the shallow S/D extension junction.

In addition, this epitaxial silicide layer also allows the formation of a thicker metal silicide on the S/D region. The thicker metal silicide can reduce the sheet resistance of the S/D region, so as to improve the effectiveness of the field effect transistor and its operating speed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention, In the drawings, FIGS. 1A to 1E cross-sectional diagrams showing the process flow of fabricating a field effect transistor according to the preferred embodiment.

DESCRIPTION OF THE PREFERRED EMBODIMENTS

Figure 1A:
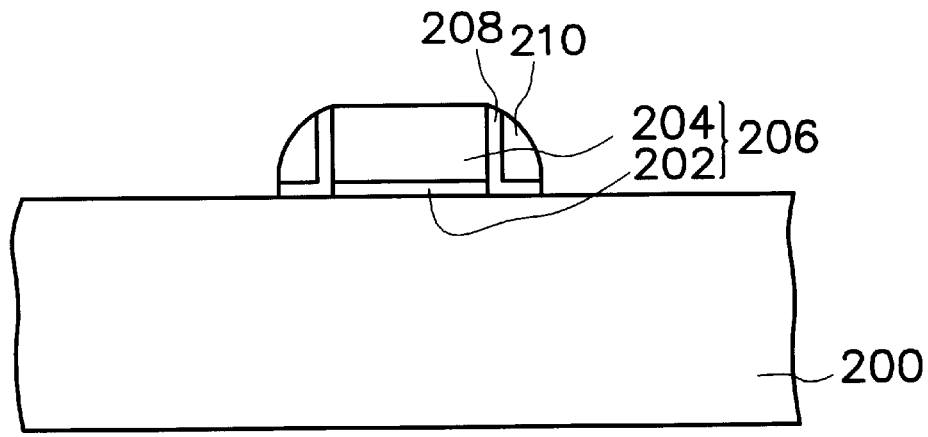

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1A, a dielectric layer 202 is formed on a substrate 200. An electrode 204 is formed on the dielectric layer 202, wherein the dielectric layer 202 and the electrode 204 constitute a gate 206. A liner oxide layer 208 and a first spacer 210 are formed to be adjacent to the sidewall of the electrode 204. The liner oxide layer 208 and the first spacer 210 are formed, in this case, by forming a liner oxide layer 208 conformal to the gate 206 on the substrate 200. A nitride layer is then formed on the liner oxide layer 208 and an anisotropic etching is performed, leaving the liner oxide layer 208 and the first spacer 210 that are adjacent to sides of the gate 206. The thickness of the liner oxide layer 208 is preferably about 50–200 Å, while the thickness of the first spacer 210 is preferably about 50–400 Å.

The function of the first spacer 210 is to elongate the channel in the transistor. This is because a shallow S/D extension junction 214 (shown in FIG. 1B) formed by the ion implantation in the subsequent step is affected by the first spacer 210 and is isolated from the gate 206 by a further distance. This prevents the problem of stacking the gate 206 and a S/D region 220 (shown in FIG. 1D) into the capacitor. However, the function of the liner oxide layer 208 is to reduce stress between the first spacer 210 and the gate 206.

Figure 1B:
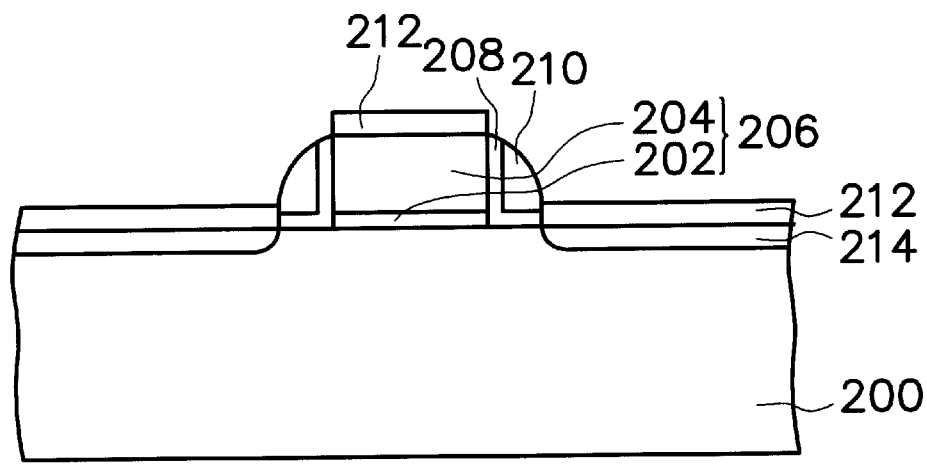

Referring to FIG. 1B, an epitaxial silicon layer 212 is formed at both sides of the first spacer 210 on the substrate 200 and on top of the electrode 204. The epitaxial silicon layer is formed in this case by chemical vapor deposition (CVD), while the material of the epitaxial silicon layer includes SiGe. A shallow S/D extension junction is then formed at both sides of the first spacer 210 in the substrate 200 below the epitaxial silicon layer 212. With the gate 206, the liner oxide layer 208, and the first spacer serving as the mask, the shallow S/D extension junction in this case is formed by implanting the substrate 200 with ions whose conductivity is different from that of the substrate 200.

Figure 1C:
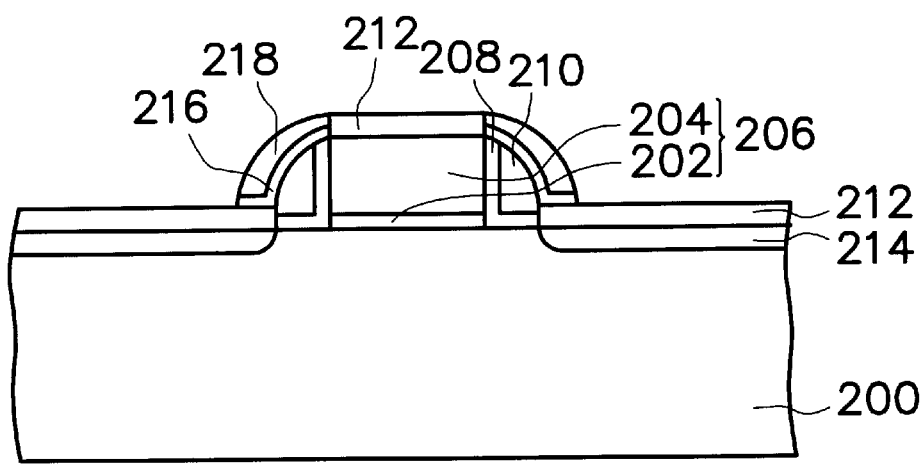

Referring to FIG. 1C, an oxide layer 216 and a second spacer 218 are formed adjacent to the sides of the first spacer 210. The oxide layer 216 and the second spacer 218 are formed by forming a oxide layer 216 to cover the surface of the epitaxial silicon layer 212 and the first spacer 210. A nitride layer is then formed to cover the oxide layer 216, while an anisotropic etching is performed to remove a part of the oxide layer 216 and a nitride layer, leaving the oxide layer 216 and the second spacer 218 at the sides of the first spacer 210. The thickness of the oxide layer 216 is preferably about 50–300 Å, while the thickness of the second spacer 218 is about 200–1500 Å.

Figure 1D:
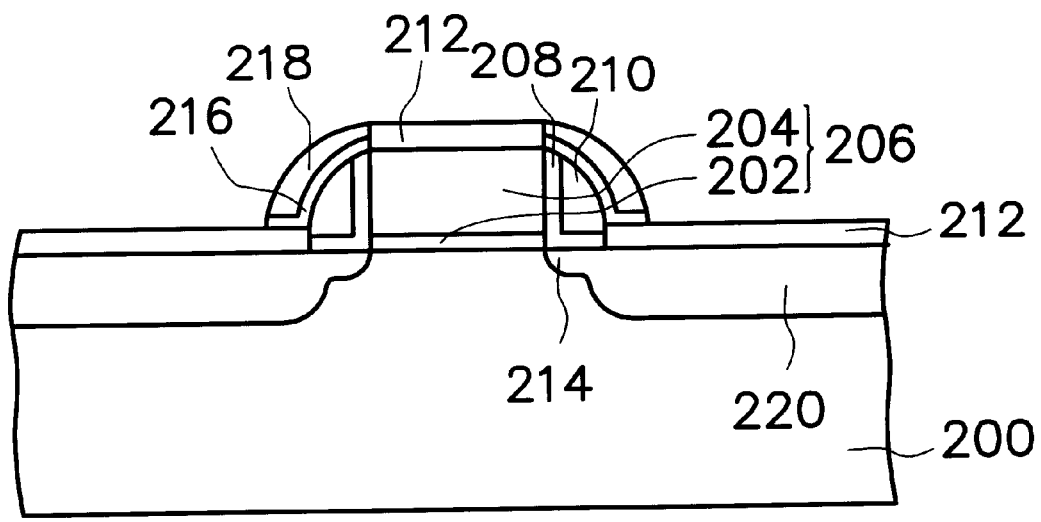

Referring to FIG. 1D, a further ion implantation is performed to form a S/D region at both sides of the second spacer 218 in the substrate below the epitaxial silicon layer 212, with the gate 206 and the second spacer 218 serving as the mask.

Figure 1E:
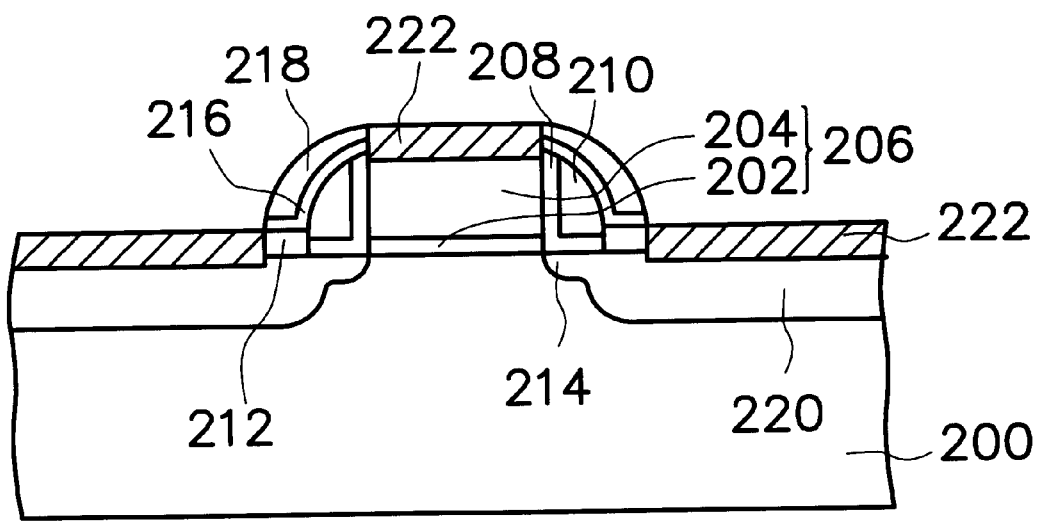

Referring to FIG. 1E, a self-aligned silicide process is performed to transform the epitaxial silicon layer at both sides of the second spacer 218 into a metal silicide layer 222, completing the process of the field effect transistor. In the invention, the metal silicide layer 222 is formed by forming a metal layer (not shown) to cover the surface of the second spacer 218 and the epitaxial silicon layer 212. A high temperature thermal process is performed to produce a nitridation reaction between the metal layer and the epitaxial silicon layer 212. This transforms the epitaxial silicon layer 212 into the metal silicide layer 222. The metal layer that remains is then removed.

Summarizing from the above, the advantage of the invention is that it forms the epitaxial layer at both sides of the first spacer before the shallow S/D extension junction is formed by ion implantation. Since the epitaxial layer formation is performed in a high temperature environment, the problem of doped ion diffusion in the shallow S/D extension junction by high temperature is prevented when the epitaxial silicon layer is formed first. Therefore, this maintains the shape and the structure of the shallow S/D extension junction. Since the metal siuicide is produced by reacting the metal layer with the epitaxial silicon layer on the surface of the S/D region, the structure of silicon in the shallow S/D extension junction is not damaged by the metal layer. As a result, a thinner shallow S/D extension junction of good quality is formed.

As the metal silicide layer is formed by the epitaxial silicon layer and the metal layer, a thicker metal silicide layer can be formed on the surface of the S/D region. A thicker metal silicide layer may help to reduce the sheet resistance of the S/D region. The field effect transistor with a better shallow S/D extension junction and a S/D region with lower sheet resistivity can therefore be manufactured according to the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a field effect transistor, comprising steps of:
   providing a substrate comprising a gate thereon, wherein the gate includes a dielectric layer on the substrate and an electrode on the dielectric layer;
   forming a liner oxide layer adjacent to and covering a sidewall of the gate;
   forming a first spacer adjacent to the liner oxide layer;
   forming an epitaxial silicon layer aside of the first spacer on the substrate;
   forming a shallow source/drain (S/D) extension junction in the substrate below the epitaxial silicon layer, wherein the epitaxial silicon layer is formed before the shallow S/D extension junction is formed;
   forming a second spacer covering the first spacer;
   forming a S/D region aside of the second spacer in the substrate below the epitaxial silicon layer; and
   transforming a part of the epitaxial silicon layer into a metal silicide layer.

2. The fabricating method of claim 1, wherein the method of forming the epitaxial silicon layer includes chemical vapor deposition (CVD).

3. The fabricating method of claim 1, wherein the epitaxial silicon layer includes SiGe.

4. The fabricating method of claim 1, wherein the method of forming the shallow S/D extension junction includes implantation of ions whose conductivity is different from that of the substrate.

5. The fabricating method of claim 1, wherein the first spacer includes a nitride layer.

6. The fabricating method of claim 1, wherein the thickness of the liner oxide layer is about 50–200 Å.

7. The fabricating method of claim 1, wherein the thickness of the first spacer is about 50–200 Å.

8. The fabricating method of claim 1, wherein the method of forming the liner oxide layer and the first spacer includes anisotropic etching.

9. The fabricating method of claim 1, wherein the thickness of the oxide layer is about 50–300 Å.

10. The fabricating method of claim 1, wherein the thickness of the second spacer is about 200–1500 Å.

11. The fabricating method of claim 1, wherein the method of transforming the epitaxial silicon layer into the metal silicide layer includes:
   forming a metal layer to cover the epitaxial silicon layer;
   performing a high temperature thermal process to produce a nitridation reaction between the metal layer and the epitaxial silicon layer; and
   removing the remaining metal layer.

12. A method of fabricating a metal silicide, comprising steps of:
   providing a substrate;
   forming an epitaxial silicon layer on the substrate;
   forming a shallow source/drain (S/D) extension junction in the substrate below the epitaxial silicon layer, wherein the epitaxial silicon layer is formed before the shallow S/D extension junction is formed;
   forming a S/D region in the substrate below the epitaxial silicon layer; and
   transforming a part of the epitaxial silicon layer into a metal silicide layer.

13. The fabricating method of claim 12, wherein the method of forming the epitaxial silicon layer includes chemical vapor deposition (CVD).

14. The fabricating method of claim 12, wherein the method of forming the shallow S/D extension junction includes implantation of ions whose conductivity is different from that of the substrate.

15. The fabricating method of claim 12, wherein the method of transforming the epitaxial silicon layer into the metal silicide layer includes:

forming a metal layer to cover the epitaxial silicon layer;

performing a high temperature thermal process to produce a nitridation reaction between the metal layer and the epitaxial silicon layer; and removing the remaining metal layer.

16. A method of fabricating a field effect transistor, comprising steps of:

providing a substrate comprising a gate thereon;

forming a liner oxide layer on a sidewall of the gate;

forming a first spacer on the liner oxide layer;

forming an epitaxial silicon layer on the substrate aside of the first spacer;

performing a first ion implantation on the substrate with the gate and the first spacer as a mask to form a shallow source/drain extension junction, wherein the epitaxial silicon layer is formed before the shallow source/drain extension junction is formed;

forming a second spacer covering the first spacer;

performing a second ion implantation on the substrate with the first spacer, the second spacer and the gate as a mask to form a source/drain region;

forming a metal layer over the substrate; and transforming the metal layer and at least a part of the epitaxial silicon layer into a metal silicide layer.

17. The fabricating method of claim 16, wherein the first ion implantation step is performed with an ion concentration lighter than an ion concentration of the second ion implantation step.

* * * * *